(12) United States Patent
Mochida

(10) Patent No.: US 7,180,817 B2
(45) Date of Patent: Feb. 20, 2007

(54) SEMICONDUCTOR MEMORY DEVICE WITH COLUMN SELECTING SWITCHES IN HIERARCHICAL STRUCTURE

(75) Inventor: Noriaki Mochida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/262,801

(22) Filed: Nov. 1, 2005

(65) Prior Publication Data
US 2006/0098515 A1    May 11, 2006

(30) Foreign Application Priority Data
Nov. 5, 2004    (JP)    ............................ 2004-321876

(51) Int. Cl.
*G11C 8/00*    (2006.01)

(52) U.S. Cl. ............ 365/230.03; 365/203; 365/230.06; 365/230.08

(58) Field of Classification Search ........... 365/230.03, 365/203, 230.06, 230.08, 207
See application file for complete search history.

(56) References Cited

U.S. PATENT DOCUMENTS

| | | | | |
|---|---|---|---|---|
| 5,761,146 A | * | 6/1998 | Yoo et al. .............. | 365/230.03 |
| 5,923,605 A | * | 7/1999 | Mueller et al. ........ | 365/230.03 |
| 6,067,270 A | * | 5/2000 | Hwang ................... | 365/230.03 |
| 6,314,044 B1 | * | 11/2001 | Sasaki et al. .......... | 365/230.03 |

FOREIGN PATENT DOCUMENTS

| | | |
|---|---|---|
| JP | 08-339687 | 12/1996 |
| JP | 09-190695 | 7/1997 |
| JP | 11-017137 | 1/1999 |
| JP | 11-126477 | 5/1999 |
| JP | 11-185468 | 7/1999 |

* cited by examiner

*Primary Examiner*—Anh Phung
*Assistant Examiner*—Toan Le
(74) *Attorney, Agent, or Firm*—Young & Thompson

(57) ABSTRACT

A semiconductor memory device has column selecting switches in a hierarchical structure. A plurality of local column selecting switches for controlling connections between bit lines and local I/O lines. A global column selecting switch connects column selecting lines and four local column selecting switches when a bit precharging signal becomes low in level for stopping precharging the bit lines. As the column selecting switches are in a hierarchical structure including the global column selecting switch that is directly controlled by the column selecting lines and the local column selecting switches that are controlled by the global column selecting switch, a load on the column selecting lines is reduced for high-speed operation. Even when bit lines are divided into a greater number of bit lines, the number of column selecting switches that are energized by a single column selecting line is not increased, and a signal delay is prevented from occurring.

8 Claims, 12 Drawing Sheets

US 7,180,817 B2

SEMICONDUCTOR MEMORY DEVICE WITH COLUMN SELECTING SWITCHES IN HIERARCHICAL STRUCTURE

BACKGROUND OF THE INVENTION

1. Field of the Invention

The present invention relates to a semiconductor memory device such as a DRAM (Dynamic Random Access Memory) which is divided into a plurality of banks where memory cells can operate independently of each other, and more particularly to a process of turning on and off column selecting switches for connecting bit lines and data input/output lines with column selecting line signals output from a column decoder.

2. Description of the Related Art

As dynamic RAMS (DRAMS) have in recent years become larger in storage capacity, faster in operation, and lower in power consumption, new specifications including DDR (Double Data Rate), DDR-II, and DDR-III have successively been proposed for higher data transfer rates that are particularly sought after in the art. Under the circumstances, it is a key point in constructing faster DRAMs to shorten column cycles which govern operating speeds in memories.

A conventional structure of a DRAM will be described below with reference to FIG. 1 of the accompanying drawings. FIG. 1 is a block diagram of a 1-Gbit DDR-II SDRAM (Synchronous Dynamic Random Access Memory). The DRAM has a known structure including memory cell array (MCA) 8 comprising a plurality of memory cells, row address buffer XAB, column address buffer XAB, row decoder (XDEC) 6, and column decoder (YDEC) 5 for specifying addresses of memory cell array 8, column selecting lines (YS) 7, column selecting switches (YSW) 80, sense amplifiers (SA) 60 for reading and writing data, main amplifier MA, output buffer DOB, input buffer DIB, control data, main amplifier MA, output buffer DOB, input buffer DIB, control signal buffers RB, CB, WB, and internal voltage generating circuit VG. These components are constructed on a single semiconductor chip by the known semiconductor fabrication technology.

In operation, address signal Ai is supplied from an external source to the DRAM, and row address buffer XAB and column address buffer XAB generate a row address signal and a column address signal, respectively. The row address signal and the column address signal are applied respectively to row decoder 6 and column decoder 5, which select a desired memory cell in memory cell array 8.

Column decoder 5 activates column selecting line 7 corresponding to the column address represented by the supplied column address signal. Column selecting line 7 that is activated by column decoder 5 turns on corresponding column selecting switch 80 to connect a bit line to a local I/O line (LIO).

In a data reading mode, data is sent through sense amplifier 60, local I/O line LIO, main I/O line MIO, a sub-amplifier, and main amplifier MA to read/write bus RWBS, from which data Dout is output through output buffer DOB.

Control signals for the DRAM include row address strobe signal /RAS, column address strobe signal /CAS, write enable signal /WE that are supplied from an external source through respective buffers RB, CB, WB to the DRAM. Based on the supplied control signals, the DRAM generates internal control signals which control operation of internal circuits of the DRAM. The DRAM has an internal power supply system including internal voltage generating circuit VG which generates various internal voltage levels including a substrate potential, a step-up power supply potential, and a step-down power supply potential in response to external power supply potential VDD and ground potential VSS that are applied from an external source to internal voltage generating circuit VG. The generated internal voltage levels are applied to internal circuits including memory cell array MCA and peripheral circuits thereof.

FIG. 2 of the accompanying drawings shows a conventional structure of memory cell array 8 shown in FIG. 1. FIG. 2 shows a circuit arrangement of two mats divided from a single bank. To these mats, there are connected column selecting lines (YS) 7 from column decoder 5 and mat activating signal lines (RCSEQB) 50 and subword lines SWL from row decoder 6. Mat activating signal lines 50 supply mat activating signals for activating the mats. Each of mat activating signal lines 50 is connected to an inverter 30 which outputs a signal having a logic level inverted from the mat activating signal, as bit line precharging signal (BLEQT) 40. Bit line precharging signal 40 is a control signal for precharging bit lines (BLT, BLB) and controlling common sources in sense amplifiers $60_1$, $60_2$. For stopping precharging the bit lines, bit line precharging signal 40 goes low in level.

Sense amplifiers $60_1$, $60_2$ amplify data that are read to bit lines BLT, BLB. Column selecting switches (YSW) $80_1$ through $80_4$ are connected between sense amplifiers $60_1$, $60_2$ and local I/O lines LIO, and are controlled by column selecting lines (YS) 7.

Operation of the memory cell array shown in FIG. 2 will be described below. It is assumed that data is read from a cell in a left one of the two mats shown in FIG. 2.

When an ACT command for selecting a row address is input, one mat activating signal line (RCSEQB) 50 is selected from the bank address and the row address (XA), making the mat activating signal high in level. Bit line precharging signal (BLEQT) 40 output from inverter 30 goes low in level, allowing a memory cell signal to be read.

When a READ command is then input, one column selecting line 7 is selected by column decoder 5. Four column selecting switches $80_1$ through $80_4$ which are connected to selected column selecting line 7 are turned on, and bit line (BLT, BLB) data are amplified by sense amplifiers $60_1$, $60_2$ and read to local I/O lines LIO.

With the memory cell array of the conventional semiconductor memory device shown in FIG. 2, all four column selecting switches $80_1$ through $80_4$ which are connected to one column selecting line 7 are simultaneously activated. Therefore, if the number of mats controlled by one column selecting line 7 increases, the number of column selecting transistors connected to that one column selecting line 7 also increases, posing a large burden on column selecting line 7, which tends to bring about a signal delay.

To meet demands for lower power consumption, the memory cell array structure shown in FIG. 2 needs to divide bit lines further into a greater number of bit lines for reducing their charging and discharging currents. Conventional semiconductor memory devices with such divided bit lines are disclosed in Japanese laid-open patent publication No. 11-17137, Japanese laid-open patent publication No. 11-126477, and Japanese laid-open patent publication No. 11-185468, for example. If bit lines are divided into a greater number of bit lines, however, since the number of column selecting transistors (YSW) that have to be energized by a single column selecting line (YS) increases, the burden on the column selecting line (YS) further increases, tending to make the signal delay worse.

SUMMARY OF THE INVENTION

It is an object of the present invention to provide a semiconductor memory device which suffers a reduced signal delay in a memory cell structure with bit lines divided into a greater number of bit lines.

The principles of the present invention are applicable to a semiconductor memory device which is divided into a plurality of banks where memory cells can operate independently of each other.

To achieve the above object, a semiconductor memory device according to the present invention has a column decoder, a plurality of local column selecting switches, and a global column selecting switch.

The column decoder activates column selecting lines disposed respectively in the banks and corresponding to column addresses input thereto.

The local column selecting switches control connections between bit lines and data input/output lines, and output data on the bit lines as read data to the data input/output lines when turned on.

The global column selecting switch connects the column selecting lines and the local column selecting switches to each other when a bit line precharging signal for controlling precharging of the bit lines and operation of sense amplifiers is in a state of stopping precharging the bit lines.

According to the present invention, the column selecting switches that are controlled by the column selecting lines are arranged in a hierarchical structure including the global column selecting switch that is directly controlled by the column selecting lines and the local column selecting switches that are controlled by the global column selecting switch. With this hierarchical structure, the column selecting lines may operate the global column selecting switch only, and, as a result, a load on the column selecting lines is reduced for high-speed operation. Even if the bit lines are divided into a greater number of bit lines, the number of column selecting switches that are energized by a single column selecting line is not increased, and a signal delay is prevented from occurring.

According to the present invention, furthermore, since the global column selecting switch is controlled by the bit line precharging signal which is generated from a row address, the global column selecting switch has already been enabled before a column address is input. Consequently, it is possible to perform hierarchical structure control without the need for a reduction in a column access speed.

Moreover, because the global column selecting switch is controlled by the bit line precharging signal which is an existing signal, the hierarchical structure can be realized without introducing an increase in the number of signal lines.

The semiconductor memory device further comprise an inverter for inverting the logic level of a mat activating signal for activating mats divided from each of the banks, and outputting the inverted signal as the bit line precharging signal.

The global column selecting switch may comprise a PMOS transistor, and the bit line precharging signal may comprise a signal which becomes low in level for stopping precharging the bit lines.

The above and other objects, features, and advantages of the present invention will become apparent from the following description with reference to the accompanying drawings which illustrate examples of the present invention.

DETAILED DESCRIPTION OF THE PREFERRED EMBODIMENTS

1st Embodiment

Figure 1:
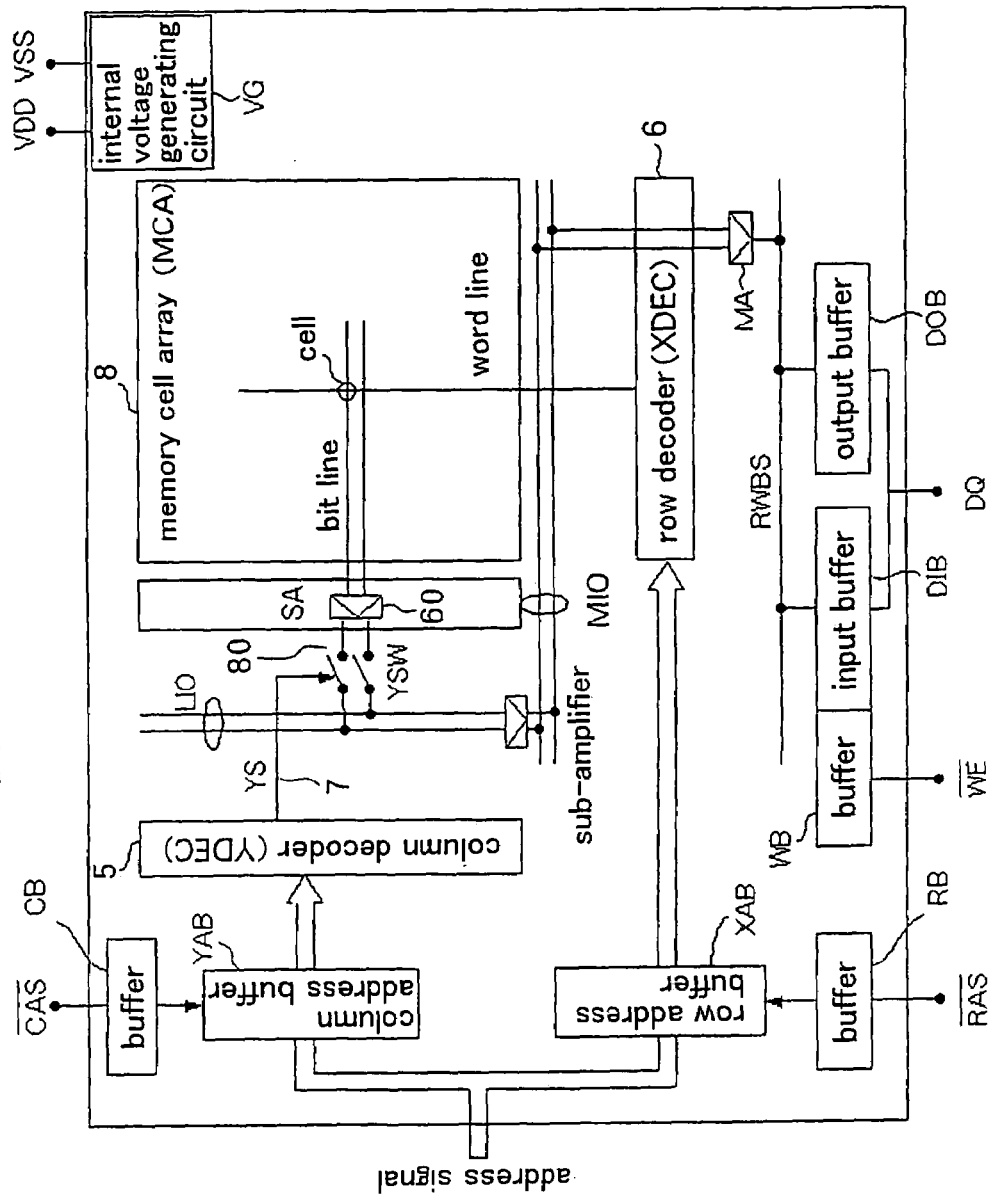
FIG. 1 is a block diagram of a 1-Gbit DDR-II SDRAM.
Figure 3:
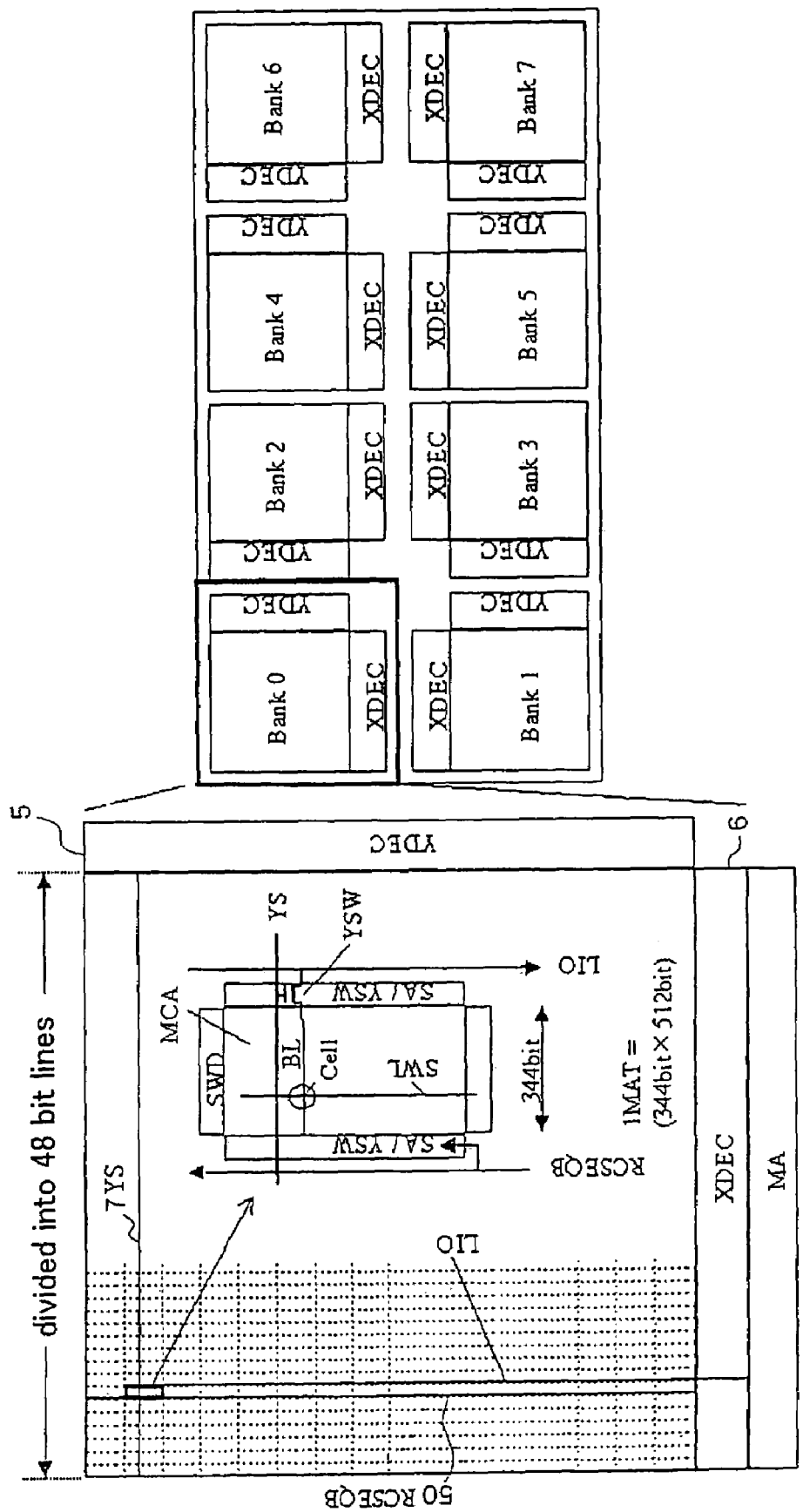
FIG. 3 is a block diagram of a general arrangement of a memory cell array of a semiconductor memory device according to a first embodiment of the present invention.

FIG. 3 shows in block form a general arrangement of a memory cell array of a semiconductor memory device according to a first embodiment of the present invention. The semiconductor memory device according to the first embodiment of the present invention has peripheral circuits of the memory cell array which are identical to those shown in FIG. 1.

FIG. 3 shows a 1-Gbit DRAM chip layout of the semiconductor memory device according to the first embodiment of the present invention. In FIG. 3, the memory cell array comprises eight banks each of 128 Mbits, with a row decoder (XDEC) and a column decoder (YDEC) disposed in each of the banks. Each of the banks is divided into memory cell arrays represented by 16 mats×48 rows and has 48 divided bit lines arranged in the X direction. Each of the mats comprises a memory cell array of 344 bits×512 bits surrounded by SA/YSW areas and SWD areas.

Figure 4:
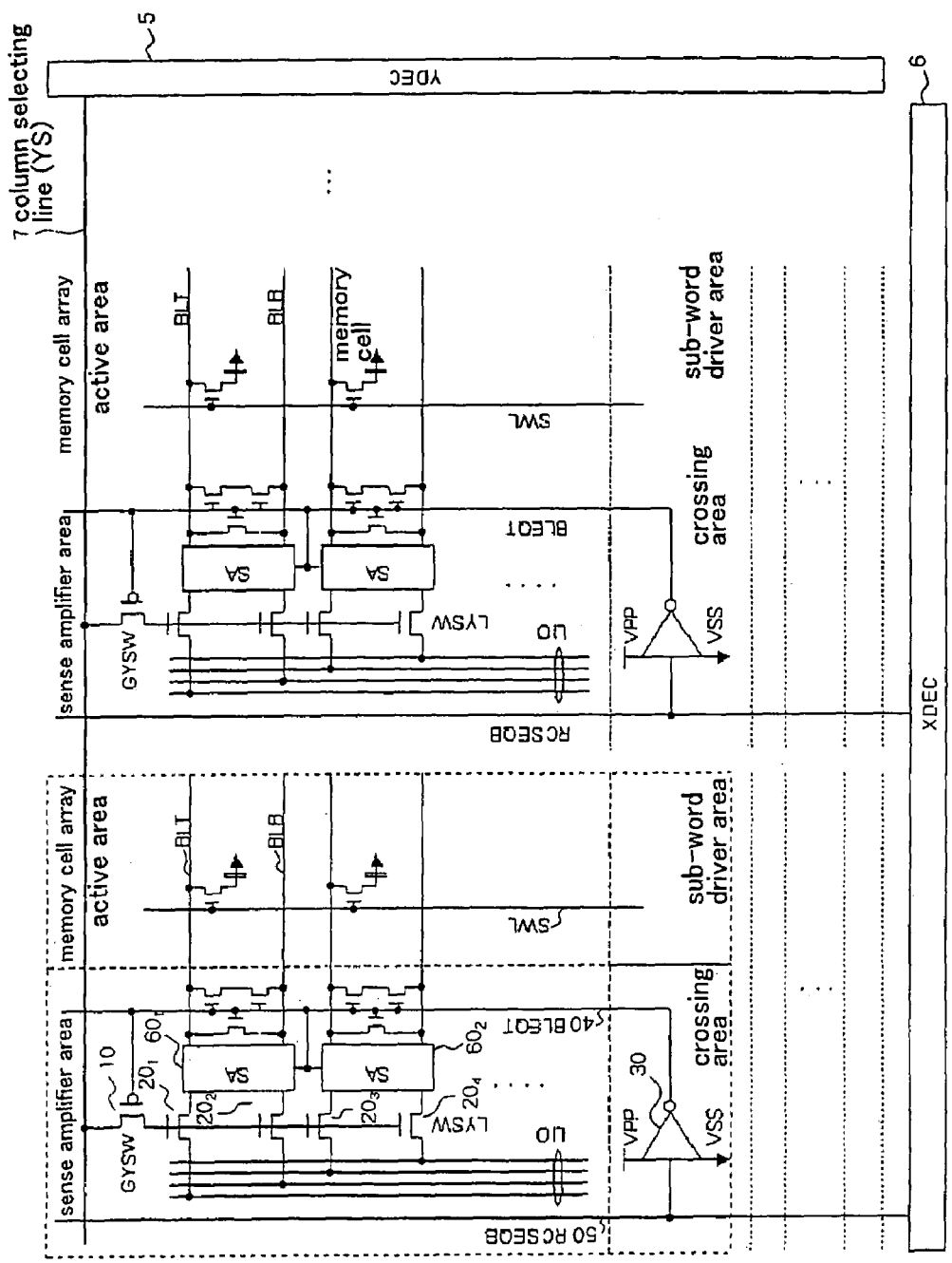
FIG. 4 is a circuit diagram of an internal structure of a memory cell array of the semiconductor memory device according to the first embodiment of the present invention.

FIG. 4 shows an internal structure (YSW hierarchical structure) of the memory cell array according to the present embodiment. FIG. 4 illustrates an area of two mats in one of the banks which is divided into 48 bit lines in the X direction. Those parts shown in FIG. 4 which are identical to those shown in FIG. 2 are denoted by identical reference characters, and will not be described in detail below.

Figure 2:
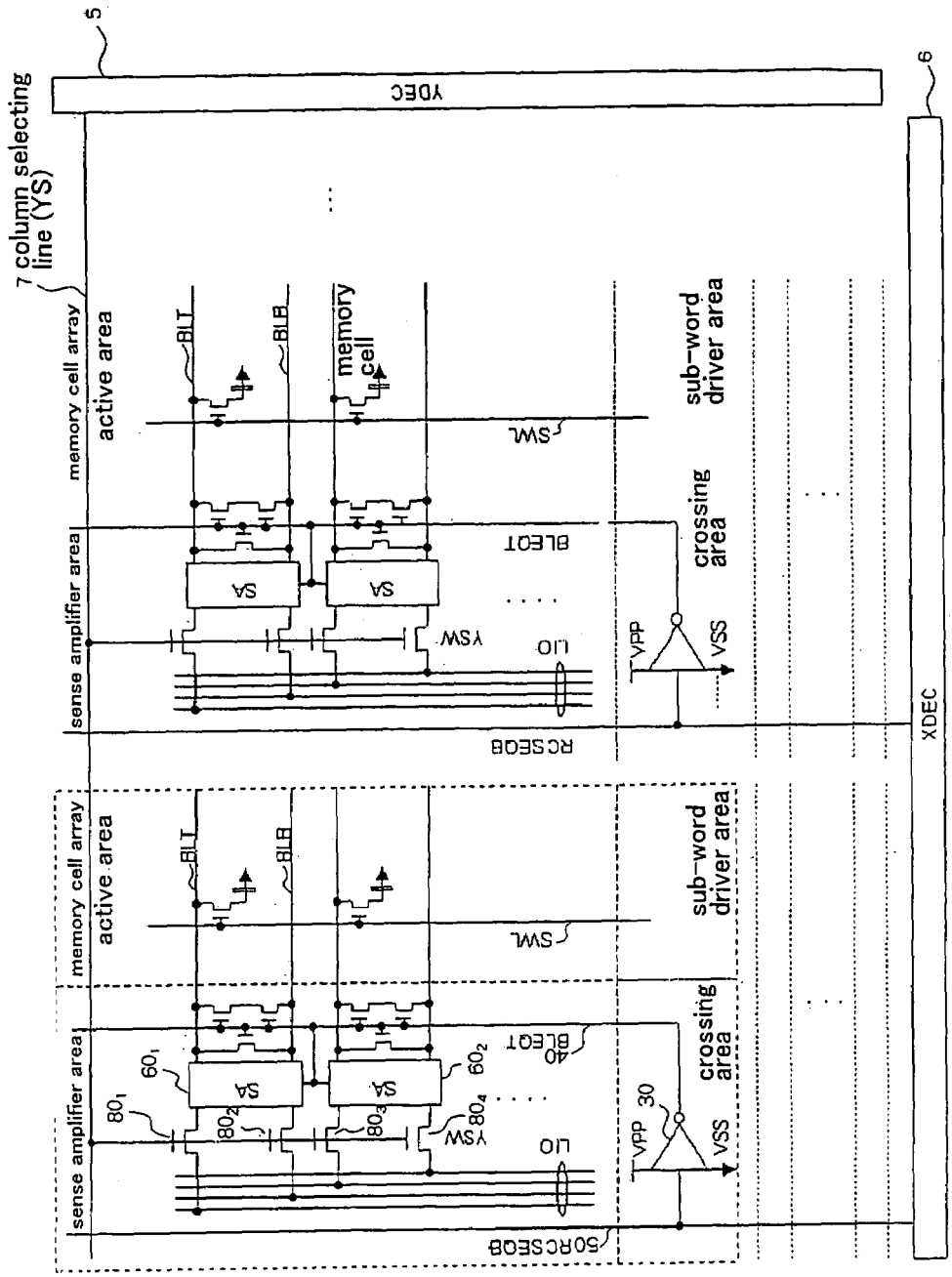
FIG. 2 is a circuit diagram of a conventional structure of a memory cell array shown in FIG. 1.

The circuit arrangement shown in FIG. 4 differs from the conventional circuit arrangement shown in FIG. 2 in that column selecting switches (YSW) $80_1$ through $80_4$ are replaced with local column selecting switches $20_1$ through $20_4$ and global column selecting switches (GYSW) 10 are newly added.

Local column selecting switches $20_1$ through $20_4$ control connections between bit lines (BLT, BLB) and local I/O lines (LIO) as data input/output lines. When local column selecting switches $20_1$ through $20_4$ are turned on, they read data on bit lines (BLT, BLB) and output the read data to local I/O lines (LIO).

Each global column selecting switch 10 connect column selecting line (YS) 7 and four local column selecting switches $20_1$ through $20_4$ to each other when bit line precharging signal (BLEQT) 40 for precharging bit lines (BLT, BLB) and controlling operation of sense amplifiers $60_1$, $60_2$ goes low in level for stopping precharging bit lines (BLT, BLB).

The circuit arrangement according to the present embodiment resides in that bit line precharging signal (BLEQT) 40 is used as an enable signal for global column selecting switch (GYSW) 10 in a crossing area between a global column selecting switch (GYSW) 10 sense amplifier and a subword driver, and global column selecting switch (GYSW) 10 is controlled by a row address signal that is applied prior to a column address signal. As shown in FIG. 4, global column selecting switch (GYSW) 10 comprises a PMOS transistor for connecting column selecting line 7 and four local column selecting switches $20_1$ through $20_4$ to each other, and is positioned at a crossing between bit line precharging signal (BLEQT) 40 and column selecting line 7.

Single column selecting line (YS) 7 extending from column decoder (YDEC) 5 is not required to directly energize all column selecting transistors (YS) connected thereto, as is conventional, but may energize global column selecting switch (GYSW) 10 only. Bit line (BLT, BLB) and local I/O line (LIO) are connected to each other when four local column selecting switches $20_1$ through $20_4$ are selectively activated by global column selecting switch (GYSW) 10.

Operation of the semiconductor memory device according to the first embodiment will be described in detail below.

Figure 5:
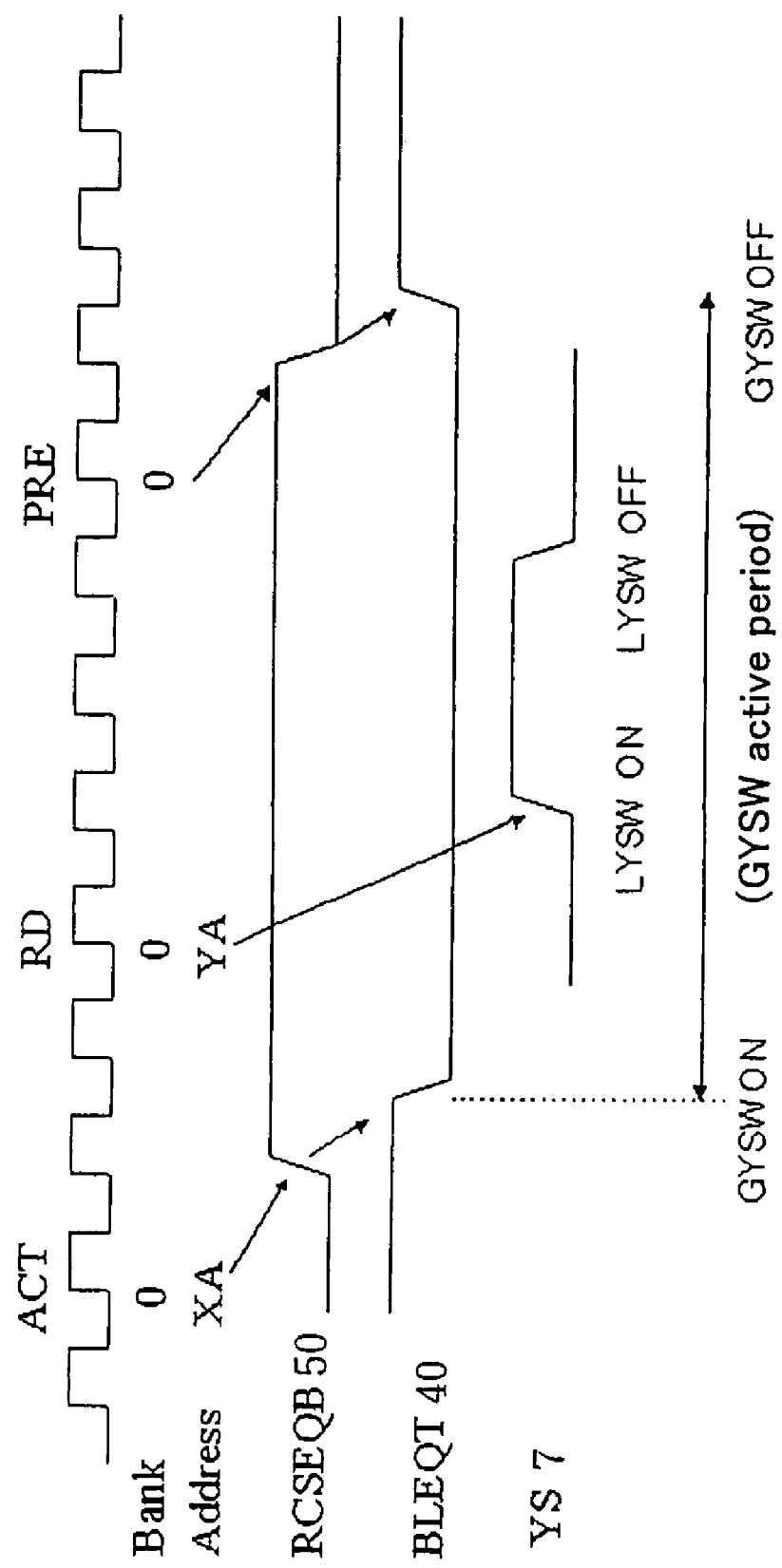
FIG. 5 is a timing chart of an operation sequence up to YSW activation of the semiconductor memory device according to the first embodiment of the present invention.

FIG. 5 is a timing chart of an operation sequence up to YSW activation of the semiconductor memory device according to the first embodiment of the present invention. By way of example, an operation sequence of ACT (row address selection)—READ (data reading)—PRE (precharging) in one bank will be described below.

When an ACT command for selecting a row address is input, one mat activating signal line (RCSEQB) 50 as a row-related signal is selected from the bank address and the row address (XA), making the mat activating signal high in level. In the crossing area shown in FIG. 4, bit line precharging signal (BLEQT) 40 goes low in level, allowing a memory cell signal to be read. At the same time, the gate potential of global column selecting switch (GYSW) 10 in the same mat goes low in level, enabling global column selecting switch (GYSW) 10.

When a READ command is then input, one column selecting line (YS) 7 is selected from the column address. As shown in FIG. 4, the source potential of previously selected global column selecting switch (GYSW) 10 goes high in level, turning on global column selecting switch (GYSW) 10. Four local column selecting switches $20_1$ through $20_4$ are activated by global column selecting switch (GYSW) 10 thus turned on, reading bit line data to local I/O lines (LIO). Global column selecting switch (GYSW) 10 is reset by a PRE command as shown in FIG. 5.

Figure 6:
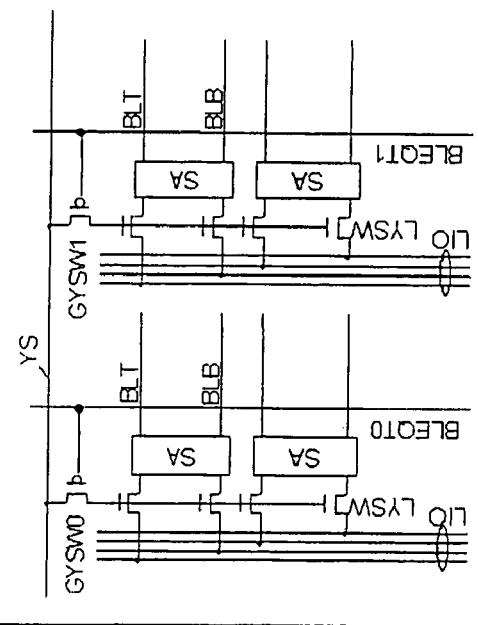
FIG. 6 is a table showing capacitive loads on column selecting lines with a YSW hierarchical structure being used and with a YSW hierarchical structure being not used.

FIG. 6 shows a comparison between a circuit arrangement in which a YSW hierarchical structure is used and a circuit arrangement in which a YSW hierarchical structure is not used. Specifically, a transistor capacitive load per column selecting line (YS) in the circuit arrangement in which a YSW hierarchical structure is used according to the present embodiment, and a transistor capacitive load per column selecting line (YS) in the circuit arrangement in which a YSW hierarchical structure is not used are compared with each other in FIG. 6.

(1) The circuit arrangement in which a YSW hierarchical structure is used:

The number of global column selecting switches (GYSW) connected to one column selecting line (YS):

One $GYSW$/one $SA$ area×49 $SA$ areas=49 $GYSW$

Diffusion layer capacitance:

When $W/Lg$=1.2 μm/0.20 μm, $Cd$=0.29 fF.

$GYSW$ load capacitance 0.29×49=14.2 fF     (a)

The load gate capacitance of transistor (YSW) connected to one GYSW:

When $W/Lg$=1.2 μm/0.20 μm, $Cd$=0.20 fF.

$YSW$ load capacitance 0.20×4=0.80 fF     (b)

(a)+(b)=14.2 fF+0.8 fF =15.0 fF.

(2) The circuit arrangement in which a YSW hierarchical structure is not used:

The number of column selecting switches (YSW) connected to one column selecting line (YS):

Four $YSW$/one $SA$ area×49 $SA$ areas=196 $YSW$

Gate capacitance:

When $W/Lg$=1.2 μm/0.20 μm, $Cg$=0.20 fF.

$YSW$ load capacitance 0.20×196=39.2 fF.

A comparison between (1) and (2) above indicates that if a YSW hierarchical structure is used, then the capacitive load per column selecting line (YS) is 15.0 fF, which is about one-third of the capacitive load of 39.2 fF caused if a YSW hierarchical structure is not used.

With the semiconductor memory device according to the present embodiment, since a YSW hierarchical structure is used, four YSW gate capacitances are replaced with one GYSW diffusion layer capacitance, and the load as viewed from column selecting line (YS) is reduced to about one-third if the four YSW gate capacitances and the one GYSW diffusion layer capacitance are of the same size. As a result, the signal delay is reduced and the access speed is increased.

Bit line precharging signal (BLEQT) 40 as a row-related signal which has heretofore been used to control sense amplifiers $60_1$, $60_2$ and bit lines (BLT, BLB) are used as a control signal for controlling global column selecting switch (GYSW) 10 that is incorporated to provide a hierarchical structure. Inasmuch as a row-related control signal is determined prior to a column address signal, if bit line precharging signal (BLEQT) 40 as such a row-related control signal is used to enable global column selecting switch (GYSW) 10, then a YSW hierarchical structure can be realized without a reduction in the access speed. In addition, as the control signal used in the YSW hierarchical structure does not need to be generated by peripheral circuits, the YSW hierarchical structure can be realized in a simple circuit arrangement.

2nd Embodiment

Figure 7:
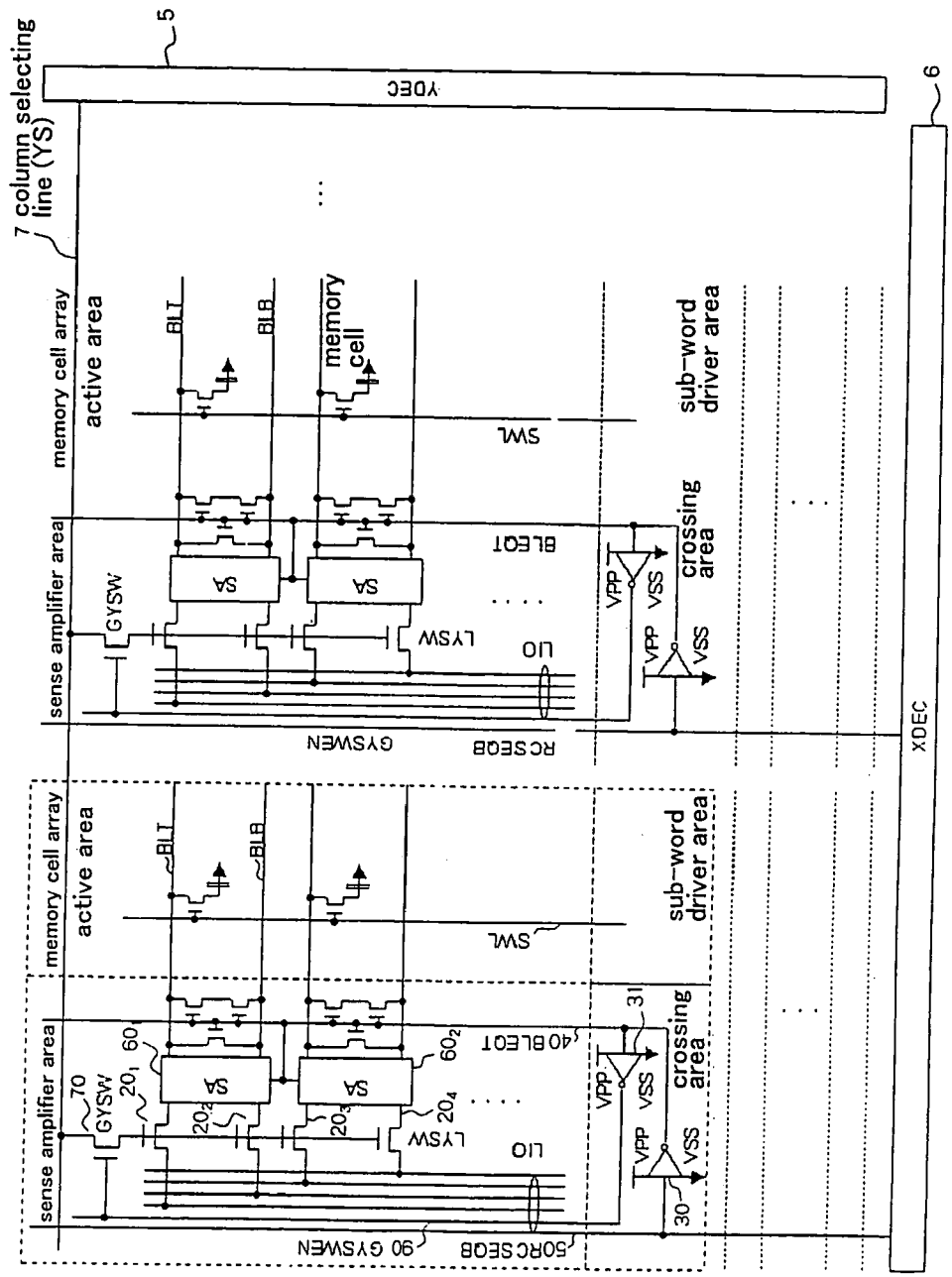
FIG. 7 is a circuit diagram of an internal structure of a memory cell array of a semiconductor memory device according to a second embodiment of the present invention.

A semiconductor memory device according to a second embodiment of the present invention will be described below. The semiconductor memory device according to the second embodiment is basically of the same arrangement as the semiconductor memory device according to the first embodiment. However, the semiconductor memory device according to the second embodiment has another YS hierarchical structure. FIG. 7 shows a structure of a memory cell array of the semiconductor memory device according to the second embodiment. Those parts shown in FIG. 7 which are identical to those shown in FIG. 4 are denoted by identical reference characters, and will not be described in detail below.

The memory cell array of the semiconductor memory device according to the second embodiment differs from the circuit arrangement shown in FIG. 4 in that global column selecting switch (GYSW) 10 in the form of a PMOS transistor is replaced with global column selecting switch (GYSW) 70 in the form of an NMOS transistor, and inverter 31 is newly added. According to the second embodiment shown in FIG. 7, inverter 31 produces a signal inverted from bit line precharging signal (BLEQT) 40 applied thereto, and outputs the inverted signal as global column selecting switch enable signal (GYSWEN) 90 to the gate of global column selecting switch (GYSW) 70. When global column selecting switch enable signal (GYSWEN) 90 becomes active, i.e., goes high in level, global column selecting switch (GYSW) 70 connects column selecting line (YS) 7 and four local column selecting switches $20_1$ through $20_4$ to each other.

According to the present embodiment, inverter 31 generates in a crossing area global column selecting switch enable signal (GYSWEN) 90 having an internal step-up power supply VPP amplitude (3.1 V) from bit line precharging signal (BLEQT) 40 which is a row-related control signal, and applies generated global column selecting switch enable signal (GYSWEN) 90, thereby controlling global column selecting switch (GYSW) 70 in the form of an NMOS transistor. Since the gate potential of global column selecting switch (GYSW) 70 is controlled by global column selecting switch enable signal (GYSWEN) 90 which is of a high potential (VPP level), and no reduction occurs in the VTN (gate threshold) level, the gate potential of local column selecting switches (LYSW) can be provided by the external power supply level (1.8 V) as before.

Figure 8:
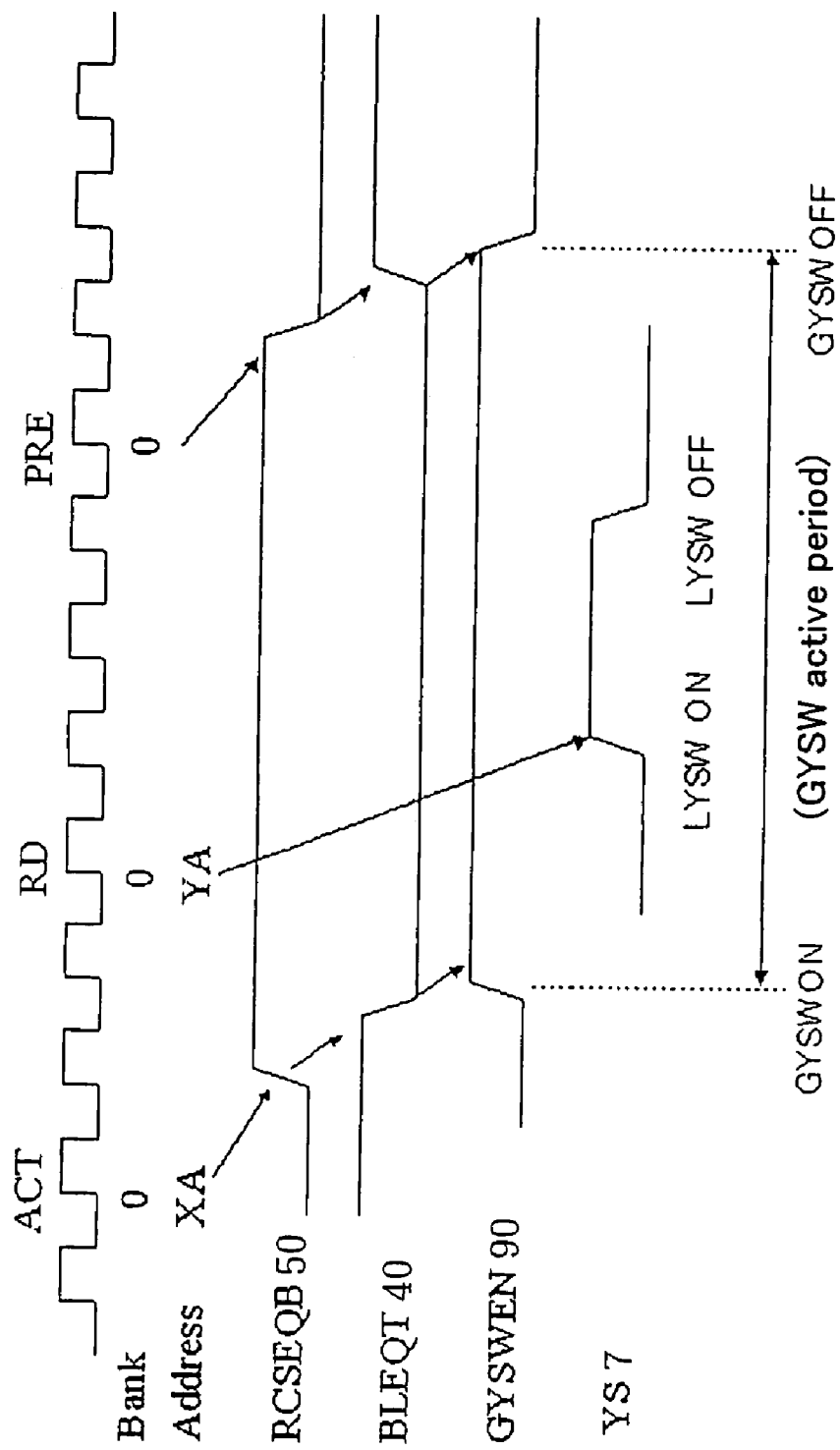
FIG. 8 is a timing chart of an operation sequence up to YSW activation of the semiconductor memory device according to the second embodiment of the present invention.

FIG. 8 shows an operation sequence up to YSW activation of the semiconductor memory device according to the second embodiment of the present invention. When an ACT command is input, one mat activating signal line (RCSEQB) 50 is selected from the bank address and the row address (XA), making the mat activating signal high in level. In the crossing area shown in FIG. 7, bit line precharging signal (BLEQT) 40 goes low in level, allowing a memory cell signal to be read. At the same time, global column selecting switch enable signal (GYSWEN) 90 which is generated from bit line precharging signal (BLEQT) 40 goes high in level, making the gate potential of global column selecting switch (GYSW) 70 high in level (VPP level=3.1 V) to enable global column selecting switch (GYSW) 70.

When a READ command is then input, one column selecting line (YS) 7 is selected by column decoder 5 based on the column address (YA). Since the source potential of previously selected global column selecting switch (GYSW) 70 has already been high in level (external power supply VDD level=1.8 V), global column selecting switch (GYSW) 70 is turned on. Four column selecting switches (LYSW) $20_1$ through $20_4$ are activated by global column selecting switch (GYSW) 70, reading bit line data to local I/O lines LIO. Global column selecting switch (GYSW) 70 is reset by a PRE command.

In the first and second embodiments described above, the present invention is applied to a 1-Gbit DRAM. However, the present invention is not limited to a 1-Gbit DRAM, and is also applicable to any other semiconductor memory devices insofar as they can connect bit lines and local I/O lines with column selecting switches.

Comparison with Another Semiconductor Memory Device Having a Similar Structure:

A hierarchical structure of column selecting lines, which belongs to the field of art of the present invention, has been used in the past based on a different control process for different purposes. Differences between such a hierarchical structure and the structure of the present invention will be described below.

Figure 9:
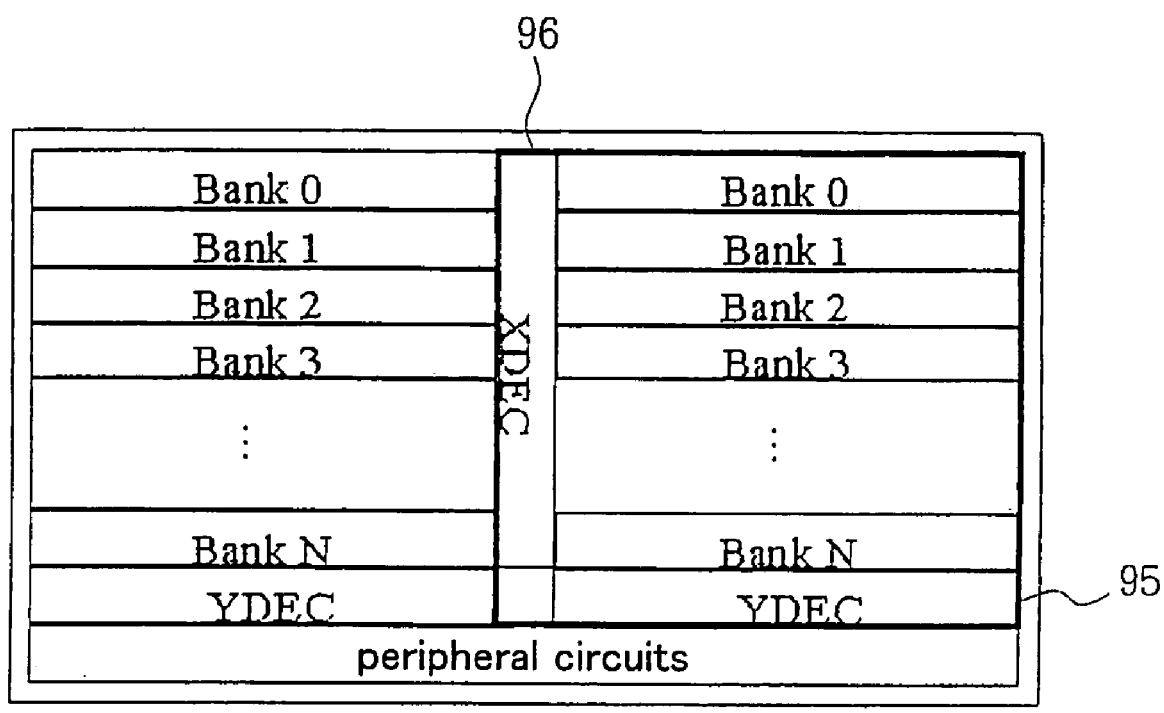
FIG. 9 is a diagram showing a bank structure of a conventional semiconductor memory device according to Comparative Example 1 where a column decoder is shared by a plurality of banks.

A multibank semiconductor memory device having a memory cell array divided into a number of banks which share a column decoder in order to reduce an increase in the area of the column decoder has been proposed in Japanese laid-open patent publication No. 9-190695 (hereinafter referred to as Comparative Example 1). A bank structure of the proposed multibank semiconductor memory device is shown in FIG. 9. As disclosed in Comparative Example 1, there has been proposed an example which employs a hierarchical process for controlling a switching means for connecting a global input/output line pair (GIO/GIOB) and a subinput/output line pair (SIO/SIOB), with a selecting signal using a row block address and a column address.

As shown in FIG. 4 of Comparative Example 1, a column selecting transistor pair (30, 32) for selectively connecting a bit line pair (BL/BLB) and the subinput/output line pair (SIO/SIOB) is controlled by a global column selecting signal (GCSL) and a local column selecting signal (LCSL) that is output from a column selecting switch (50) which is controlled by a selecting signal, using a row block address and a column address, for controlling the switching means.

PROBLEM 1 OF COMPARATIVE EXAMPLE 1

Figure 10:
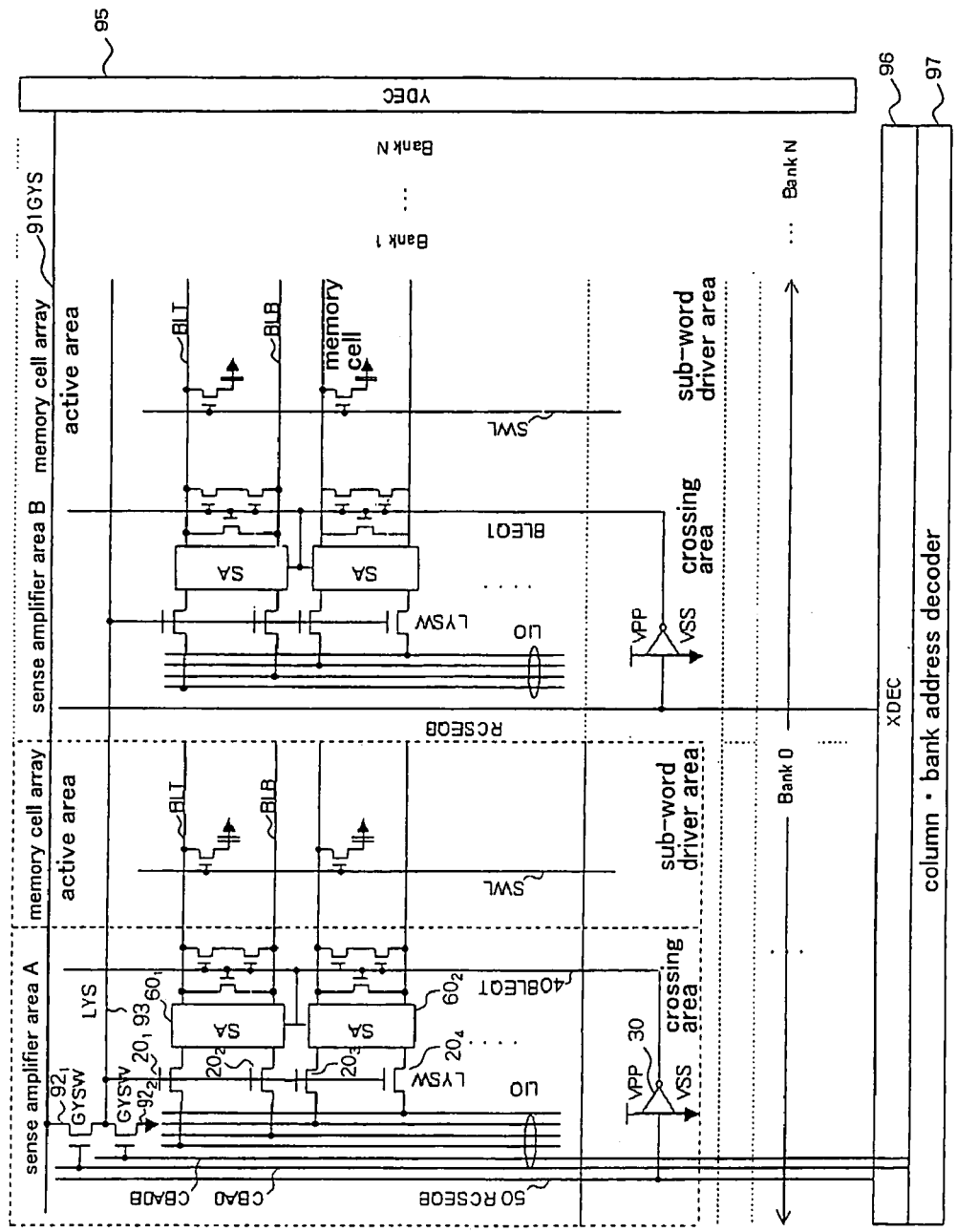
FIG. 10 is a circuit diagram of an internal structure of a memory cell array of the conventional semiconductor memory device according to Comparative Example 1.

An internal structure of a memory cell array of the conventional semiconductor memory device according to Comparative Example 1 is shown in FIG. 10. The semiconductor memory device comprises a large-scale 1-Gbit SDRAM having a plurality of banks each including a number of memory mats. In each of the memory mats, when local column selecting line (LYS) 93 is energized by global column selecting switches (GYSW) $92_1$, $92_2$, local column selecting line (LYS) 93 connects local column selecting switches $20_1$ through $20_4$ arrayed in the X direction. Local I/O lines (LIO) that are connected to local column selecting switches $20_1$ through $20_4$ are connected to global input/output line GIO or main input/output line IO by switches or sub-amplifiers that are controlled by other column signals.

Figure 11:
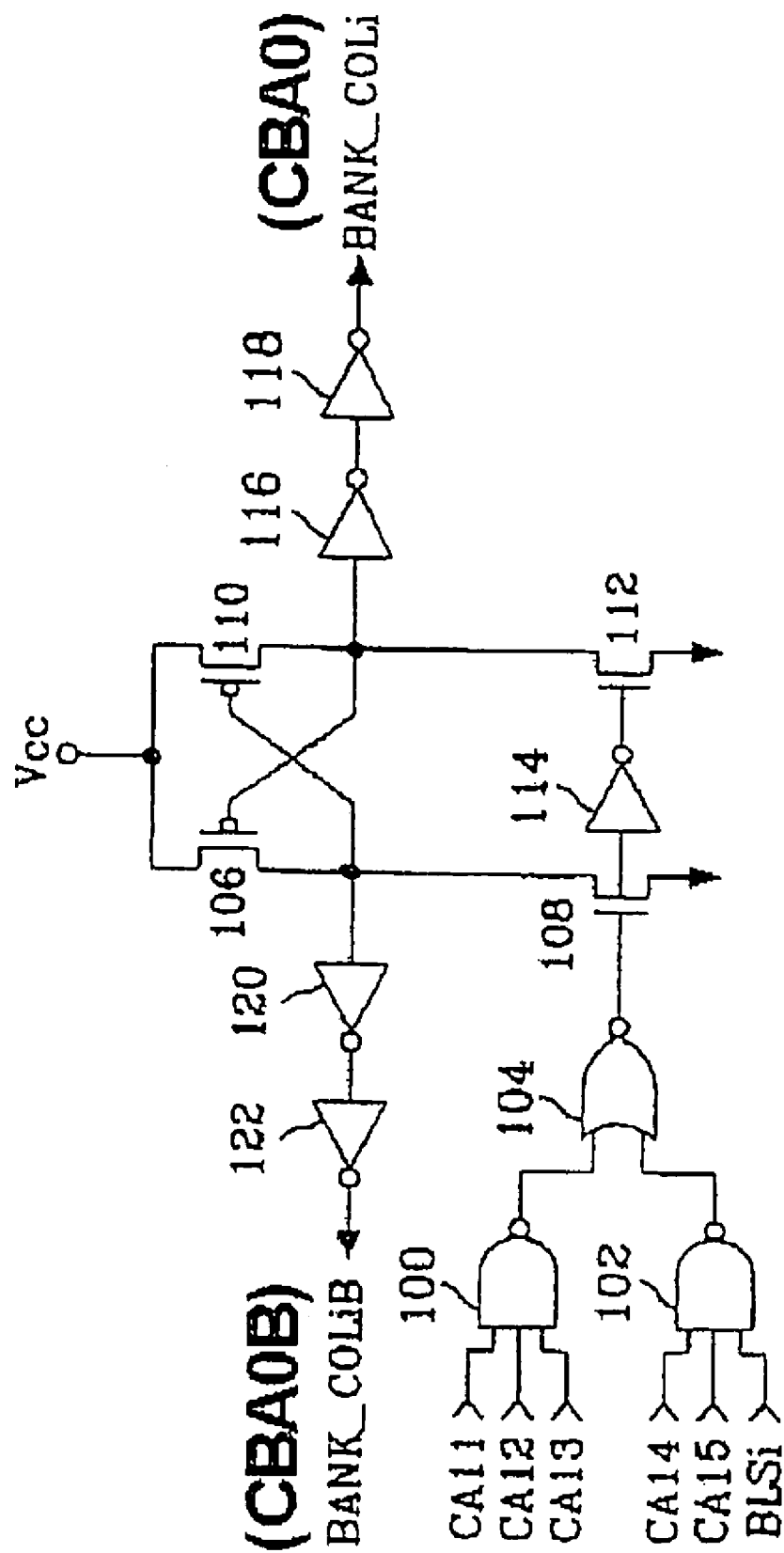
FIG. 11 is a circuit diagram of a column selecting switch control circuit of the conventional semiconductor memory device shown in FIG. 10.

A column selecting switch control circuit of the conventional semiconductor memory device according to Comparative Example 1 is shown in FIG. 11. As shown in FIG. 11, the column selecting switch control circuit comprises NAND gates 100, 102, NOR gate 104, PMOS transistors 106, 110, NMOS transistor 108, NMOS transistor 112, and inverters 114, 116, 118, 120, 122.

The column selecting switch control circuit is activated when all of block selecting signal BLSi based on row address decoding and bank selecting column address signals CA11 through CA13 are high in level.

As can be seen from a comparison between Comparative Example 1 and the first embodiment shown in FIG. 4, according to Comparative Example 1, a hierarchical signal including both a row address and a column address is generated, and Comparative Example 1 is not arranged to perform column hierarchical structure control only with a row address signal that has already been determined by a row command (ACTIVE) prior to a column command (READ or WRITE).

This is because, in an arrangement where a column decoder is shared by a plurality of banks, multibank interleaving is performed by a column address, and column hierarchical structure control cannot be performed by a row address only.

According to such a hierarchical structure control process, in order to prevent erroneous READ/WRITE operation from taking place in other banks, a predetermined time after control signals CBA0 (BANK COL) and CBA0B (BANK COLB) for controlling global column selecting switches (GYSW) $92_1$, $92_2$ are determined, global column selecting line (GYS) (GCSL in Comparative Example 1) 91 is selected. Therefore, if a hierarchical structure control signal is produced in combination with a column-related signal as with Comparative Example 1, a serious problem arises in that the access speed is reduced.

According to the present invention, since column hierarchical structure control is performed prior to not only a row address, but also a column command (READ or WRITE), the access speed is not reduced, thereby solving the above problem.

Figure 12:
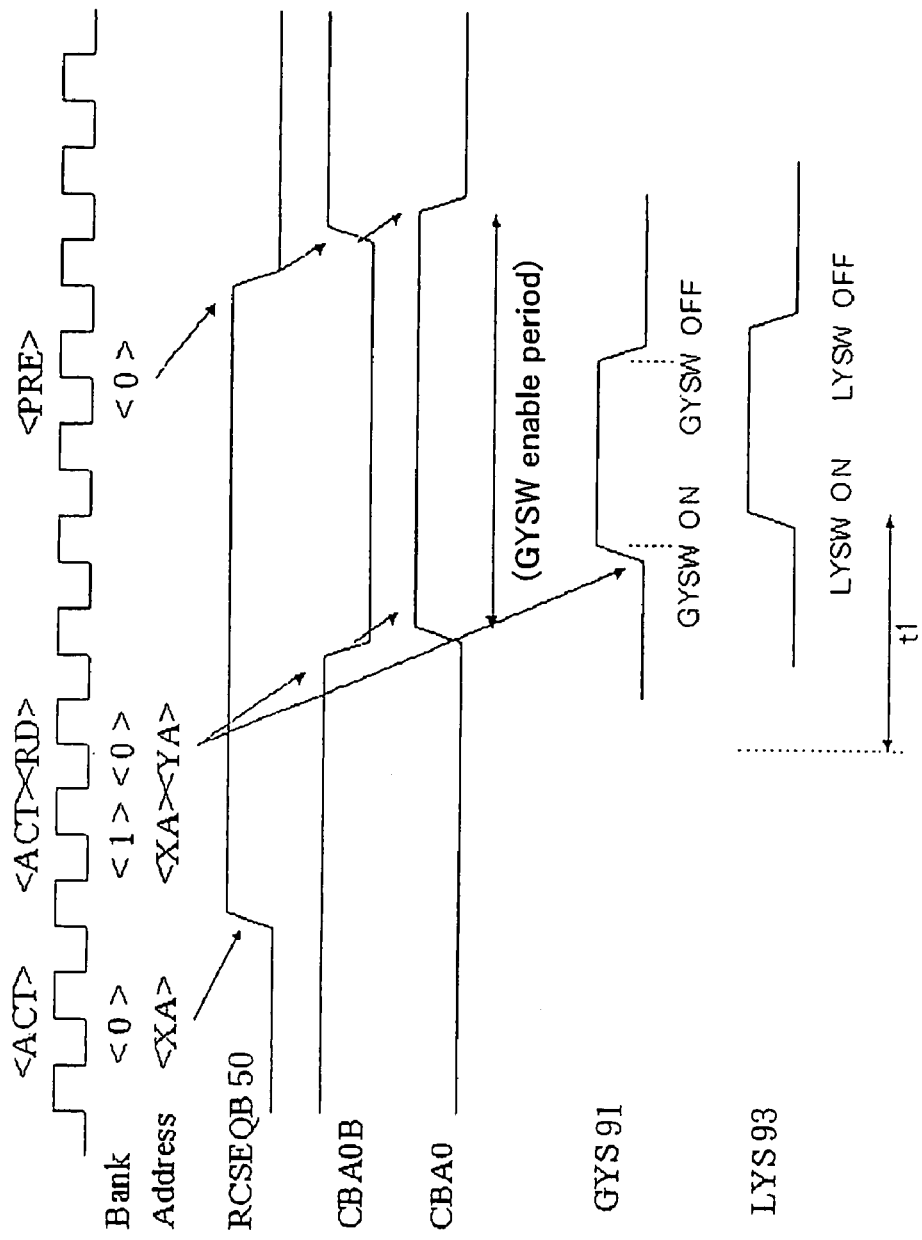
FIG. 12 is a timing chart of an operation sequence up to YSW activation of the conventional semiconductor memory device shown in FIG. 10.

Differences between Comparative Example 1 and the present invention will be described below with reference to operational waveforms shown in FIG. 12. When active commands ACT0, ACT1 are input, multibank interleaving is performed on Bank0, Bank1. Then, when a read command is input to Bank0, a column bank address is decoded to render control signal CBA0 high and control signal CBA0b low, thereby enabling complementary global column selecting switches (GYSW) $92_1$, $92_2$.

To prevent the above erroneous READ/WRITE operation from occurring, single global column selecting line (GYS) 91 is selected from column address YA, and, as shown in FIG. 10, four local column selecting switches (LYSW) $20_1$ through $20_4$ are activated by global column selecting switches (GYSW) $92_1$, $92_2$, reading bit line data from bit lines (BLT, BLB) to local I/O lines (LIO). Global column selecting switches or transistors (GYSW) $92_1$, $92_2$ are reset by precharging command PRE or a column address in another bank.

PROBLEM 2 OF COMPARATIVE EXAMPLE 1

Because of the layout for hierarchical structure control, Comparative Example 1 suffers the following three disadvantages as shown in FIG. 10:

(1) Two global column selecting transistors (GYSW) $92_1$, $92_2$ are required.

(2) A sense amplifier area needs additional interconnections for transmitting complementary control signals CAB0, CBA0B in order to control two global column selecting transistors (GYSW) $92_1$, $92_2$.

(3) Local column selecting line (LYS) 93 is needed parallel to global column selecting line (GYS) 91.

Reasons for the above three disadvantages will be described below.

(1) According to the conventional idea, there is no floating node based on common sense with respect to the control of the gate potential of a column selecting switch (YSW), and the gate potential is necessarily fixed to a high level or a low level.

For example, multibank interleaving on Bank0, Bank1 (activation of both banks) in FIG. 10 which shows the semiconductor memory device according to Comparative Example 1 will be considered below. If only one transistor (GYSW $92_1$) is used as a global column selecting switch, then when Bank0 operates in a read mode, the gate level of local column selecting switches $20_1$ through $20_4$ in the column unselected bank (Bank1) floats because of signal noise from global column selecting line (GYS) 91, such as coupling noise produced when the signal on global column selecting line (GYS) 91 goes high. At this time, in the interleaving operation, an electric charge flows in from a local I/O line (LIO) which has been precharged to a VBLR level (0.7 V: one-half of the drive voltage for sense amplifiers (SA)) in the column unselected bank (Bank1) to lower the amount of information on the Lo side which has been read to the bit line, possibly breaking the cell time or delaying the access time. Specifically, since a plurality of word lines are simultaneously activated with respect to certain global column selecting line (GYS) 91, the amount of cell information may possibly be reduced, causing problems in the floating state. According to Comparative Example 1, therefore, global column selecting switch (GYSW) $92_2$ as a complementary transistor is required to hold local column selecting line (LYS) 93 in the column unselected bank (Bank1) to the low level.

According to the present invention, as shown in FIG. 4, the semiconductor memory device is of such an arrangement that column decoder 5 is not shared by a plurality of banks, and a plurality of word lines are not simultaneously activated with respect to one column selecting line (YS) 7. Furthermore, no problem arise when the gate potential of local column selecting switches $20_1$ through $20_4$ floats because the bit line BL level of unselected column selecting switches (YSW) and the level of local I/O lines (LIO) are of the same potential (e.g., 0.7 V). Therefore, only one global column selecting switch (GYSW) is sufficient. If the sense amplifier area is wide enough, a CMOS structure may be employed and one of the global column selecting switches (GYSW) which is unselected may be kept to the GND level.

(2) According to the present invention, furthermore, since the gate control signal for global column selecting switch (GYSW) is a row-related signal used in the conventional sense amplifiers, no additional interconnection for transmitting control signal CBAB is needed.

(3) In addition, inasmuch as the memory cell array shown in FIG. 4 has single column selecting line (YS) 7, it does not require local column selecting line (LYS) 93 shown in FIG. 10.

Consequently, the semiconductor memory device according to the present invention has a much smaller area overhead than Comparative Example 1.

Finally, differences between Comparative Example 1 and the present invention will be described below.

(1) Column decoder and memory structure:

Comparative Example 1 is concerned with a hierarchical column selecting line structure for performing multibank interleaving in a memory cell array in which a number of banks share a column decoder.

According to the present invention, a hierarchical column selecting line structure is provided to efficiently lower a load for shortened column cycles in a memory cell array in which a number of banks do not share a column decoder.

(2) Control of a hierarchical signal:

According to Comparative Example 1, a hierarchical signal needs to be controlled by a combination of a row address and a column address due to the interleaving operation, and an access speed is lowered in order to keep an operation timing margin.

According to the present invention, an access speed is increased because a row address signal that has already been determined is used prior to a column command (READ or WRITE) for hierarchical structure control for column selection.

(3) Hierarchical area overhead:

According to Comparative Example 1, two global column selecting switches (GYSW) each in the form of a transistor need to be employed and controlled by a complementary signal in order to prevent data destruction or access delay from occurring in the multibank interleaving mode. Consequently, it is necessary to supply two signals, i.e., control signals CBA, CBAB, to the sense amplifier area through interconnections that are provided in addition to conventional interconnections. Moreover, column selecting lines need to be provided in two hierarchical layers including global column selecting lines (GYS) and local column selecting lines (LYS), and the hierarchical structure resuits in an increased area overhead.

According to the present invention, however, since bit line precharging signal (BLEQT) 40 that is a row-related signal which has heretofore been used for precharging sense amplifiers and bit lines is also used for column hierarchical structure control, there is no increase in the number of signal lines in the sense amplifier area. No local column selecting line (LYS) is required. As described above with respect to the first embodiment of the present invention, only one global column selecting switch (GYSW) is sufficient. Accordingly, the semiconductor memory device according to the present invention has a much smaller area overhead than Comparative Example 1.

While preferred embodiments of the present invention have been described using specific terms, such description is for illustrative purposes only, and it is to be understood that changes and variations may be made without departing from the spirit or scope of the following claims.

What is claimed is:

1. A semiconductor memory device which is divided into a plurality of banks where memory cells can operate independently of each other, comprising:

a column decoder for activating column selecting lines disposed respectively in the banks and corresponding to column addresses input thereto;

a plurality of local column selecting switches for controlling connections between bit lines and data input/output lines, and outputting data on said bit lines as read data to the data input/output lines when turned on; and a global column selecting switch for connecting said column selecting lines and said local column selecting switches to each other when a bit line precharging signal for controlling precharging of said bit lines and operation of sense amplifiers is in a state of stopping precharging said bit lines.

2. A semiconductor memory device according to claim 1, wherein said global column selecting switch comprises a PMOS transistor, and said bit line precharging signal comprises a signal which is low in level for stopping precharging said bit lines.

3. A semiconductor memory device according to claim 1, further comprising:

an inverter for inverting the logic level of a mat activating signal for activating mats divided from each of said banks, and outputting the inverted signal as said bit line precharging signal.

4. A semiconductor memory device according to claim 3, wherein said global column selecting switch comprises a PMOS transistor, and said bit line precharging signal comprises a signal which becomes low in level for stopping precharging said bit lines.

5. A semiconductor memory device which is divided into a plurality of banks where memory cells can operate independently of each other, comprising:

a column decoder for activating column selecting lines disposed respectively in the banks and corresponding to column addresses input thereto;

a plurality of local column selecting switches for controlling connections between bit lines and data input/output lines, and outputting data on said bit lines as read data to the data input/output lines when turned on;

a first inverter for inverting the logic level of a bit line precharging signal for controlling precharging of said bit lines and operation of sense amplifiers, and outputting the inverted signal as a global column selecting switch enable signal; and a global column selecting switch for connecting said column selecting lines and said local column selecting switches to each other when said global column selecting switch enable signal becomes active.

6. A semiconductor memory device according to claim 5, wherein said global column selecting switch comprises an NMOS transistor, and said bit line precharging signal comprises a signal which is low in level for stopping precharging said bit lines.

7. A semiconductor memory device according to claim 5, further comprising:

a second inverter for inverting the logic level of a mat activating signal for activating mats divided from each of said banks, and outputting the inverted signal as said bit line precharging signal.

8. A semiconductor memory device according to claim 7, wherein said global column selecting switch comprises an NMOS transistor, and said bit line precharging signal comprises a signal which becomes low in level for stopping precharging said bit lines.

* * * * *

UNITED STATES PATENT AND TRADEMARK OFFICE
CERTIFICATE OF CORRECTION

PATENT NO. : 7,180,817 B2
APPLICATION NO. : 11/262801
DATED : February 20, 2007
INVENTOR(S) : Noriaki Mochida Page 1 of 1

It is certified that error appears in the above-identified patent and that said Letters Patent is hereby corrected as shown below:

Amend item (73) on the title page, to read as follows:

--(73)   Assignee:      ELPIDA MEMORY,INC., Tokyo (JP)--.

Signed and Sealed this

Fourth Day of March, 2008

JON W. DUDAS
*Director of the United States Patent and Trademark Office*